United States Patent
Yoshioka et al.

(10) Patent No.: US 10,574,197 B2
(45) Date of Patent: Feb. 25, 2020

(54) MULTI-STAGE HIGH FREQUENCY AMPLIFIER

(71) Applicant: MITSUBISHI ELECTRIC CORPORATION, Tokyo (JP)

(72) Inventors: Takaaki Yoshioka, Tokyo (JP); Shintaro Shinjo, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 42 days.

(21) Appl. No.: 15/771,343

(22) PCT Filed: Dec. 8, 2015

(86) PCT No.: PCT/JP2015/084399
§ 371 (c)(1),
(2) Date: Apr. 26, 2018

(87) PCT Pub. No.: WO2017/098580
PCT Pub. Date: Jun. 15, 2017

(65) Prior Publication Data
US 2018/0331664 A1  Nov. 15, 2018

(51) Int. Cl.
*H03F 3/04* (2006.01)
*H03F 3/191* (2006.01)
(Continued)

(52) U.S. Cl.
CPC ................ *H03F 3/21* (2013.01); *H03F 1/56* (2013.01); *H03F 3/193* (2013.01);
(Continued)

(58) Field of Classification Search
CPC ... H03F 3/21; H03F 1/56; H03F 3/193; H03F 2200/411; H03F 2200/387;
(Continued)

(56) References Cited

U.S. PATENT DOCUMENTS 5,805,023 A  9/1998 Fukuden
6,812,794 B1 * 11/2004 Mori ................ H03F 1/565
330/277
(Continued)

FOREIGN PATENT DOCUMENTS

JP  60-9317 U  1/1985
JP  8-130419 A  5/1996
(Continued)

OTHER PUBLICATIONS

International Search Report for PCT/JP2015/084399 (PCT/ISA/210) dated Mar. 1, 2016.

*Primary Examiner* — Khanh V Nguyen
(74) *Attorney, Agent, or Firm* — Birch, Stewart, Kolasch & Birch, LLP (57) ABSTRACT

A first stabilizing circuit (7a) is disposed between a first transistor (5a) and a first output matching circuit (10a) in a first stage. A second stabilizing circuit (7b) is disposed between a second transistor (5b) and a second output matching circuit (10b) in a second stage. The first stabilizing circuit (7a) includes a first band-pass filter and a first resistor (103a) connected in parallel. The first band-pass filter allows a signal of a frequency f1 lower than a central frequency fc of the operation frequencies as an amplifier to pass through. The second stabilizing circuit (7b) includes a second band-pass filter and a second resistor (103b) connected in parallel. The second band-pass filter allows a signal of a frequency f2 higher than the central frequency fc to pass through.

2 Claims, 6 Drawing Sheets

(51) Int. Cl.
*H03F 3/21* (2006.01)
*H03F 1/56* (2006.01)
*H03F 3/193* (2006.01)

(52) U.S. Cl.
CPC .. *H03F 2200/222* (2013.01); *H03F 2200/318* (2013.01); *H03F 2200/387* (2013.01); *H03F 2200/411* (2013.01)

(58) Field of Classification Search
CPC ......... H03F 2200/318; H03F 2200/222; H03F 3/19; H03F 2200/451; H03F 1/26; H03F 3/191; H03F 1/565
USPC .......................................... 330/98, 302, 310
See application file for complete search history.

(56) References Cited

U.S. PATENT DOCUMENTS

| | | | | |
|---|---|---|---|---|
| 7,202,736 | B1* | 4/2007 | Dow | H03F 1/14 330/129 |
| 7,468,636 | B2* | 12/2008 | Matsuda | H03F 1/0261 330/302 |
| 8,803,615 | B2* | 8/2014 | Cabanillas | H03F 1/565 330/305 |
| 2007/0188224 | A1* | 8/2007 | Dow | H03F 1/14 330/129 |

FOREIGN PATENT DOCUMENTS

| | | |
|---|---|---|
| JP | 10-83998 A | 3/1998 |
| JP | 11-46160 A | 2/1999 |
| JP | 2001-189641 A | 7/2001 |
| JP | 2003-92520 A | 3/2003 |
| JP | 2005-217753 A | 8/2005 |

* cited by examiner

MULTI-STAGE HIGH FREQUENCY AMPLIFIER

TECHNICAL FIELD

The present invention relates to a high-frequency power amplifier amplifying a high-frequency signal of millimeter-wave, microwave, or the like. In particular, the present invention relates to a multi-stage high-frequency amplifier including two or more stages connected in series, each stage including a transistor and a matching circuit.

BACKGROUND ART

In high-frequency and low-noise amplifiers, the following characteristics are required: noise in a high-frequency signal amplified and output is low, and the operation is stable from lower range to higher range outside an operation frequency bandwidth. For example, Patent Literature 1 discloses such a type of conventional amplifier whose circuit configuration includes a stabilizing circuit arranged between an input terminal and a gate side of a transistor. The stabilizing circuit includes: an LC series resonant circuit consisting of an inductor and a capacitor (its resonant frequency is equal to the frequency of a high-frequency signal from the input terminal); and a resistor connected in parallel with the resonant circuit. In this circuit configuration, the LC series resonant circuit functions as a band-pass filter that can reduce the transmission loss of a signal at the resonant frequency of the resonant circuit, whereas outside the range of the operation frequency (in lower and higher ranges), due to the influence of the resistor connected in parallel with the LC series resonant circuit, it is possible to increase the transmission loss. Consequently, stabilization can be achieved from lower to higher ranges outside the frequency bandwidth while a noise figure at the operation frequency is not deteriorated.

CITATION LIST

Patent Literature

[PLT 1]
Japanese Unexamined Patent Application Publication No. 2005-217753

SUMMARY OF INVENTION

Technical Problem

However, in a multistage amplifier configuration including a plurality of amplifiers each having a circuit configuration described in Patent Literature 1 and connected in series, the transmission losses of a signal in respective stages are summed in the upper and lower ranges outside of the resonant frequency of the LC series resonant circuit. As a result, undesirably, the noise figure is deteriorated at the ends of the operation frequency bandwidth and the gain becomes uneven within the operation frequency bandwidth. For example, in a multi-stage and low-noise amplifier which is required to be operated between 13 GHz and 17 GHz, if a stabilizing circuit consisting of a resistor and an LC series resonant circuit resonating at a frequency of 15 GHz, which is the center of the above operation frequency, is disposed, lossless characteristics are obtained at 15 GHz. However, there is following problems: at the lower limit 13 GHz and the upper limit 17 GHz of the operation frequency, the transmission losses of a signal in the individual stages are summed so that the noise figure is deteriorated; and the gain flatness is deteriorated between 13 GHz and 17 GHz.

The present invention is made in order to solve the above problems, and an object thereof is to provide a multi-stage high-frequency amplifier that can obtain a preferable noise figure over a broad bandwidth and improve gain flatness in the operation frequencies.

Solution to Problem

A multi-stage high-frequency amplifier according to the present invention includes: transistors arranged in different stages and connected in series, each transistor being provided with a source inductor, and an output matching circuit being disposed between adjacent two of the transistors; a first stabilizing circuit disposed between an output of a first transistor among the transistors and a first output matching circuit connected to the first transistor, the first stabilizing circuit comprising a first band-pass filter, a high-pass filter, and a first resistor that are connected in parallel, the first band-pass filter allowing a signal of a frequency f1 lower than a central frequency fc of an operation frequencies as an amplifier to pass through, the high-pass filter allowing a signal of a frequency equal to or higher than the central frequency fc to pass through; and a second stabilizing circuit disposed between an output of a second transistor being one of the transistors and different from the first transistor and a second output matching circuit connected to the second transistor, the second stabilizing circuit comprising a second band-pass filter, a low-pass filter, and a second resistor that are connected in parallel, the second band-pass filter allowing a signal of a frequency f2 higher than the central frequency fc to pass through, the low-pass filter allowing a signal of a frequency equal to or lower than the central frequency fc to pass through.

Advantageous Effects of Invention

The multi-stage high frequency amplifier according to the present invention includes a first stabilizing circuit and a second stabilizing circuit that are connected in series to form multiple stages. The first stabilizing circuit includes a first band-pass filter, a high-pass filter, and a first resistor that are connected in parallel. The first band-pass filter allows a signal of a frequency f1 to pass through. The second stabilizing circuit includes a second band-pass filter a low-pass filter, and a second resistor that are connected in parallel. The second band-pass filter allows a signal of a frequency f2 to pass through. As a result of such a configuration, a preferable noise figure can be obtained over a broad bandwidth, and the gain flatness can be improved in the operation frequencies.

DESCRIPTION OF EMBODIMENTS

Some embodiments of the present invention will now be described in more detail with reference to the accompanying drawings.

Embodiment 1

Figure 1:
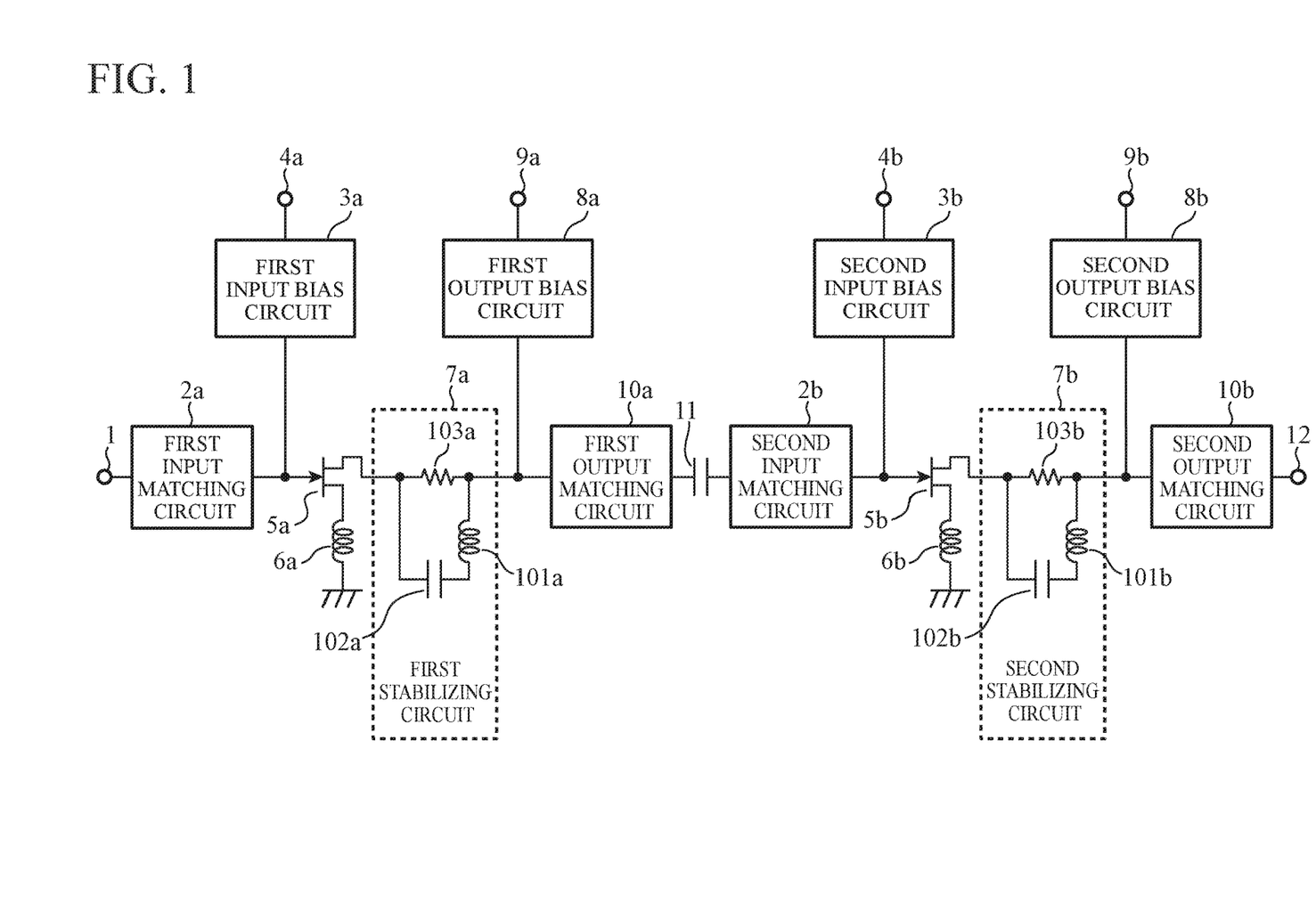
FIG. 1 is a configuration diagram illustrating a multi-stage high-frequency amplifier according to Embodiment 1 of the present invention.

FIG. 1 is a configuration diagram of a multi-stage high-frequency amplifier according to this embodiment.

The multi-stage high-frequency amplifier of this embodiment includes a high-frequency input terminal 1, a first input matching circuit 2a, a first input bias circuit 3a, a first input bias power terminal 4a, a first transistor 5a, a first source inductor 6a, a first stabilizing circuit 7a, a first output bias circuit 8a, a first output bias power terminal 9a, a first output matching circuit 10a, a capacitor 11, a second input matching circuit 2b, a second input bias circuit 3b, a second input bias power terminal 4b, a second transistor 5b, a second source inductor 6b, a second stabilizing circuit 7b, a second output bias circuit 8b, a second output bias power terminal 9b, a second output matching circuit 10b, and a high-frequency output terminal 12.

The high-frequency input terminal 1 is provided for inputting a high-frequency signal to the multi-stage high-frequency amplifier. The components between the first input matching circuit 2a and the first output matching circuit 10a form a first-stage amplifier viewed from the high-frequency input terminal 1. The first input matching circuit 2a functions as an input side matching circuit of the first transistor 5a. The first input bias circuit 3a supplies a bias voltage to the gate of the first transistor 5a. The first input bias power terminal 4a is provided for supplying a power to the first input bias circuit 3a. The first transistor 5a is a device to amplify a high-frequency signal whose source terminal is connected to one end of the first source inductor 6a, and another end thereof is grounded. The first stabilizing circuit 7a is disposed between the first transistor 5a and the first output matching circuit 10a and includes a series resonant circuit and a first resistor 103a connected in parallel. The series resonant circuit includes a first inductor 101a and a first capacitor 102a and resonates at a frequency f1. The first output matching circuit 10a functions as an output side matching circuit of the first transistor 5a. The capacitor 11 functions as a DC cut-off capacitor which blocks direct current components in a signal output from the first output matching circuit 10a.

The components between the second input matching circuit 2b and the second output matching circuit 10b form a second-stage amplifier viewed from the high-frequency input terminal 1. This structure is the same as that of the first-stage amplifier including the components between the first input matching circuit 2a and the first output matching circuit 10a. The second stabilizing circuit 7b includes a series resonant circuit and a second resistor 103b connected in parallel. The series resonant circuit includes a second inductor 101b and a second capacitor 102b and resonates at a frequency f2. It is assumed that the relation among fc, which represents the central value of the operation frequency as the multi-stage amplifier, the frequency f1, and the frequency f2 is represented by $\Delta = fc - f1 = f2 - fc$.

Note that, in a low noise amplifier, in many cases, a source inductor is used to maintain the stability within the operation bandwidth. However, in such a structure, due to the mounting of the source inductor, the stability in higher range than the operation frequency is deteriorated. Thus, a stabilizing circuit having a transmission loss is required to be inserted not only for a lower range than the operation frequency but also for a higher range than the operation frequency. Further, since it is required to maintain stability of transistors in respective stages, the first stabilizing circuit 7a and the second stabilizing circuit 7b should not be directly connected to each other in series, and the first stabilizing circuit 7a is required to be disposed between the first transistor 5a and the first output matching circuit 10a forming a stage, and the second stabilizing circuit 7b is required to be disposed between the second transistor 5b and the second output matching circuit 10b forming another stage, respectively.

In this configuration, the LC series resonant circuit in the first stabilizing circuit 7a functions as a first band-pass filter allowing signals of the frequency f1 to pass through. When the LC series resonant circuit is connected in parallel with the first resistor 103a, the resonant circuit functions as a band-pass filter at the resonant frequency f1 of the LC series resonant circuit, and the transmission loss of becomes zero ideally. On the other hand, when the frequency deviates from f1, the input signal propagates through the first resistor 103a connected in parallel with the LC series resonant circuit, and as a result, the loss increases and the stabilization is achieved. Similarly, the LC series resonant circuit in the second stabilizing circuit 7b functions as a second band-pass filter allowing signals of the frequency f2 to pass through. At the frequency f2, the resonant circuit functions as a band-pass filter, and the transmission loss becomes zero ideally. On the other hand, when the frequency deviates from f2, the input signal propagates through the second resistor 103b connected in parallel with the LC series resonant circuit, and as a result, the loss increases and the stabilization is achieved. It should be noted that the transmission loss outside the bandwidth range varies in accordance with the magnitude of the resistance values of the first and second resistors 103a and 103b. Namely, the resistance values of the first and second resistors 103a and 103b are set in accordance with the required stability of signals outside the bandwidth range.

Next, the frequency characteristics of transmission loss in a case that the first stabilizing circuit 7a and the second stabilizing circuit 7b are connected in series to form a multi-stage circuit will be described.

Figure 2:
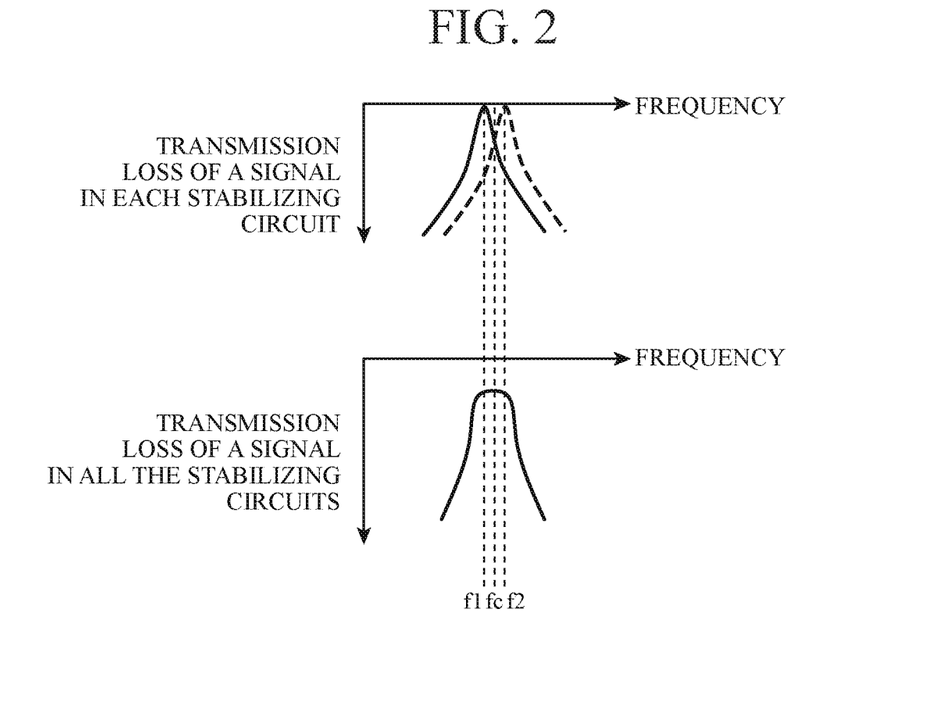
FIG. 2 is an explanatory diagram illustrating frequency characteristics of transmission loss of a signal in the multi-stage high-frequency amplifier according to Embodiment 1 of the invention.
Figure 3:
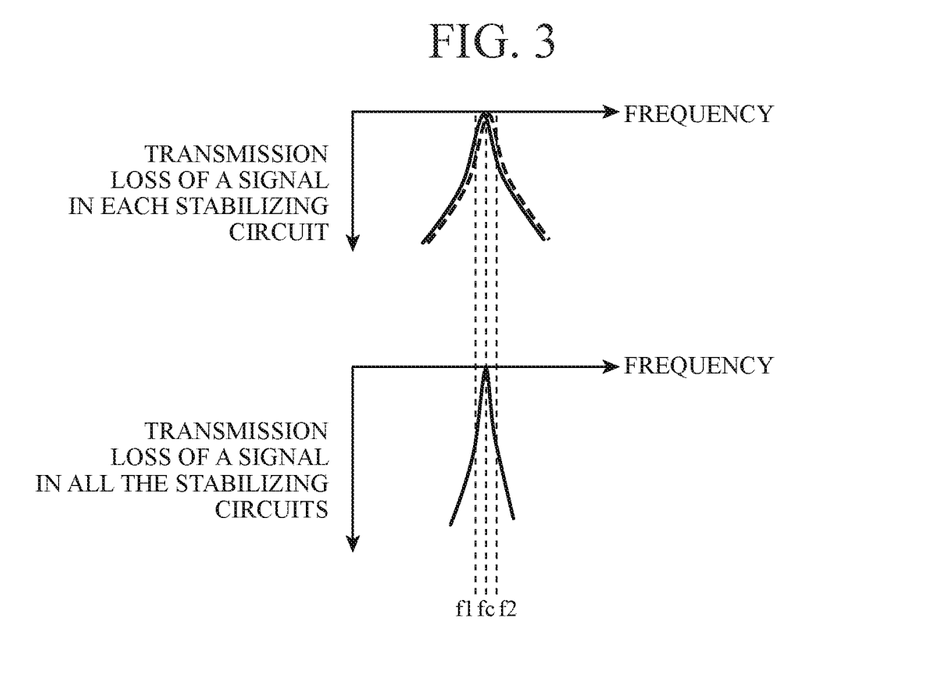
FIG. 3 is an explanatory diagram illustrating frequency characteristics of transmission loss of a signal in a conventional technique applied to a multi-stage amplifier.

FIG. 2 illustrates the frequency characteristics of transmission loss in Embodiment 1. The upper graph of FIG. 2 shows the frequency characteristics of transmission loss in each stabilizing circuit. The lower graph of FIG. 2 shows the frequency characteristics of the summed transmission loss of all the stabilizing circuits that are connected in series. Ideally, the transmission loss becomes zero at the frequency f1 in the first stabilizing circuit 7a (the characteristics represented by the solid line) and at the frequency f2 in the second stabilizing circuit 7b (the characteristics represented by the dotted line). FIG. 3 illustrates the frequency characteristics of transmission loss when two or more stabilizing circuits, each of which is described in Patent Literature 1, are connected in series. Similar to FIG. 2, the upper graph of FIG. 3 shows the frequency characteristics of transmission loss in each stabilizing circuit (the characteristics illustrated by solid and dotted lines). The lower graph of FIG. 3 shows the frequency characteristics of the summed transmission loss of all the stabilizing circuits that are connected in series. It should be noted that the characteristics illustrated by solid and dotted lines in the upper graph of FIG. 3 are actually identical, although they are illustrated as slightly different on the graph for showing the two lines clearly.

In each of the first stabilizing circuit 7a and the second stabilizing circuit 7b, the transmission loss becomes zero at the frequency fc ideally. In the conventional circuit configuration including two stabilizing circuits connected in series, the transmission loss becomes zero at the frequency fc whereas it steeply increases in lower and higher ranges of the frequency fc. Thus, the noise figure deteriorates at both ends of the operation bandwidth, and the gain is uneven within the bandwidth of the amplifier. In contrast, in Embodiment 1, although the transmission loss increases at the frequency fc compared to a case where the conventional circuit structure is applied to a multi-stage amplifier, the deviation of the transmission loss becomes small in the range between the frequency f1 and the frequency f2. Thus, the gain flatness in the operation bandwidth of the amplifier is enhanced compared to the case where the conventional technique is applied to a multi-stage amplifier.

As described above, the multi-stage high-frequency amplifier according to Embodiment 1 includes: transistors arranged in different stages and connected in series, each transistor being provided with a source inductor, and an output matching circuit being disposed between adjacent two of the transistors; a first stabilizing circuit disposed between an output of a first transistor among the transistors and a first output matching circuit connected to the first transistor, the first stabilizing circuit comprising a first band-pass filter and a first resistor that are connected in parallel, the first band-pass filter allowing a signal of a frequency f1 lower than a central frequency fc of an operation frequencies as an amplifier to pass through; and a second stabilizing circuit disposed between an output of a second transistor being one of the transistors and different from the first transistor and a second output matching circuit connected to the second transistor, the second stabilizing circuit comprising a second band-pass filter and a second resistor that are connected in parallel, the second band-pass filter allowing a signal of a frequency f2 higher than the central frequency fc to pass through. Thus, a preferable noise figure can be obtained over a broad bandwidth, and the gain flatness within the operation frequency can be enhanced.

Embodiment 2

Figure 4:
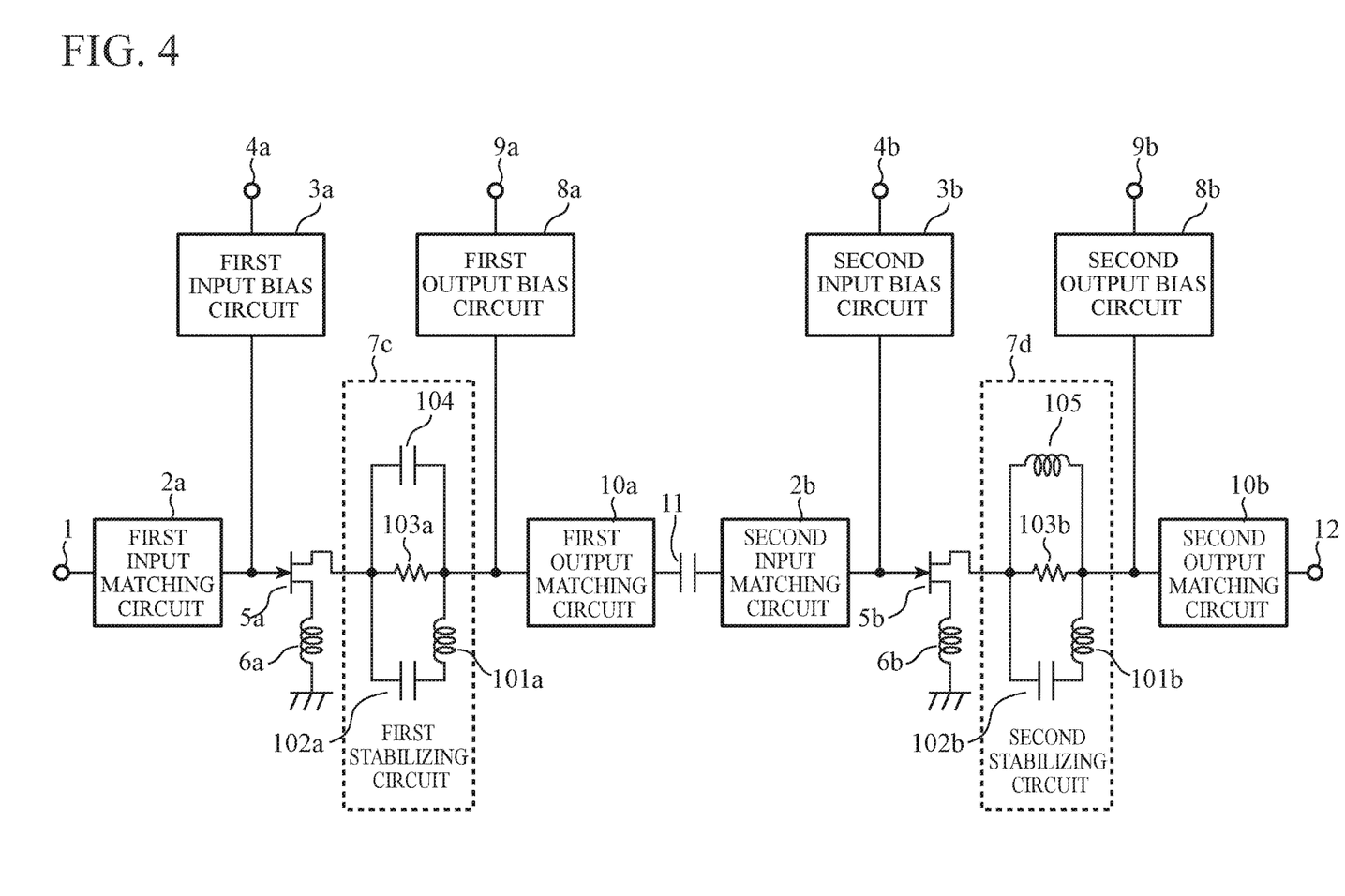
FIG. 4 is a configuration diagram illustrating a multi-stage high-frequency amplifier according to Embodiment 2 of the invention.

FIG. 4 is a configuration diagram illustrating a multi-stage high-frequency amplifier according to Embodiment 2. In Embodiment 2, the configurations of a first stabilizing circuit 7c and a second stabilizing circuit 7d differ from the configurations of the first stabilizing circuit 7a and the second stabilizing circuit 7b in Embodiment 1. The configuration other than the first and second stabilizing circuits 7c and 7d in FIG. 4 is the same as that of Embodiment 1 in FIG. 1, and the same components are thus denoted by the same reference numerals without redundant description.

The first stabilizing circuit 7c includes an LC series resonant circuit, a first resistor 103a, and a capacitor 104 that are connected in parallel. The LC series resonant circuit includes a first inductor 101a and a first capacitor 102a and resonates at a frequency f1. The capacitor 104 functions as a high-pass filter allowing signals of a frequency equal to or higher than a central frequency fc of the operation frequencies as the multi-stage amplifier to pass through. The second stabilizing circuit 7d includes an LC series resonant circuit, a second resistor 103b, and an inductor 105 that are connected in parallel. The LC series resonant circuit includes a second inductor 101b and a second capacitor 102b and resonates at a frequency f2. The inductor 105 functions as a low-pass filter allowing signals of a frequency equal to or lower than the central frequency fc of the operation frequencies as the multi-stage amplifier to pass through. Here, the following relation is assumed: $\Delta = fc - f1 = f2 - fc$.

Next, the frequency characteristics of the transmission loss in a case that the first stabilizing circuit 7c and the second stabilizing circuit 7d are connected in series to form a multi-stage circuit will be described.

Figure 5:
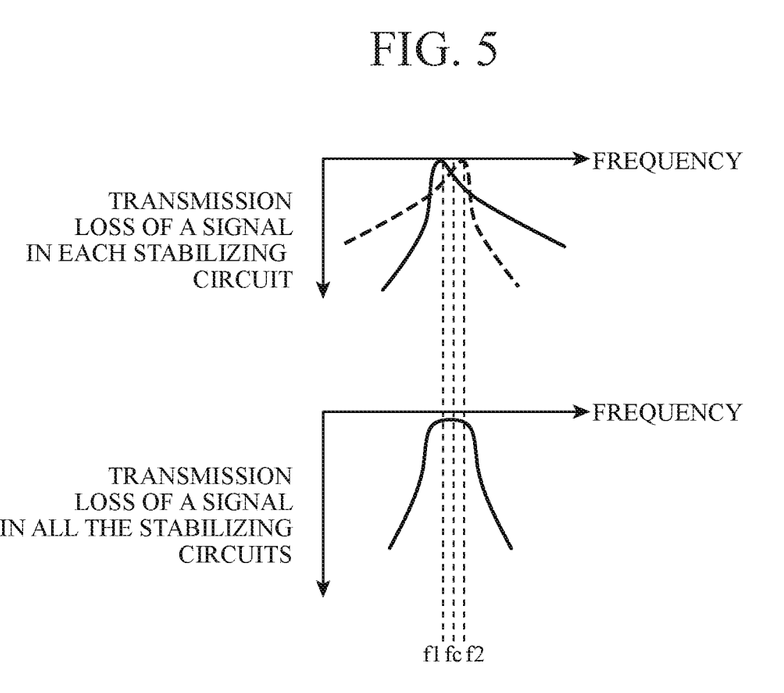
FIG. 5 is an explanatory diagram of frequency characteristics of transmission loss of a signal in the multi-stage high-frequency amplifier according to Embodiment 2 of the invention.

FIG. 5 illustrates the frequency characteristics of transmission loss in Embodiment 2. The upper graph of FIG. 5 shows the frequency characteristics of transmission loss in each of the first stabilizing circuit 7c and the second stabilizing circuits 7d. The lower graph of FIG. 5 shows the frequency characteristics of the summed transmission loss of all the first and second stabilizing circuits 7c and 7d that are connected in series. In the upper graph of FIG. 5, the solid line shows the frequency characteristics of the first stabilizing circuit 7c, and the dotted line shows the frequency characteristics of the second stabilizing circuit 7d.

Ideally, the transmission loss of the first stabilizing circuit 7c becomes zero at the frequency f1 whereas the transmission loss of the second stabilizing circuit 7d becomes zero at the frequency f2. In addition, in the first stabilizing circuit 7c, since the capacitor 104 connected in parallel with the first stabilizing circuit 7c functions as a high-pass filter, the transmission loss in a range higher than the frequency f1 becomes smaller than the transmission loss in a range lower than the frequency f1. On the other hand, in the second stabilizing circuit 7d, since the inductor 105 connected in parallel with the second stabilizing circuit 7d functions as a low-pass filter, the transmission loss in a range lower than the frequency f2 becomes smaller than the transmission loss in a range higher than the frequency f2. Namely, the frequency characteristics of the transmission loss in the first stabilizing circuit 7c and those in the second stabilizing circuit 7d become asymmetrical with respect to the resonant frequencies f1 and f2 of the LC series resonant circuits. Therefore, in a case where the first stabilizing circuit 7c and the second stabilizing circuit 7d are connected in series, the frequency characteristics of the transmission loss is flattened, and the transmission loss at the frequency fc is reduced compared to Embodiment 1.

As described above, in Embodiment 2, the frequency deviation of the transmission loss between the frequency f1 and the frequency f2 becomes small. Thus, the gain flatness within the operation bandwidth as an amplifier is enhanced compared to the case where the conventional circuit configuration is applied to a multi-stage amplifier. Further, the transmission loss at the frequency fc is reduced compared to Embodiment 1. As a result, deterioration of the noise figure is prevented, and the gain flatness is further enhanced compared to Embodiment 1.

As described above, the multi-stage high-frequency amplifier according to Embodiment 2 includes: transistors arranged in different stages and connected in series, each transistor being provided with a source inductor, and an output matching circuit being disposed between adjacent two of the transistors; a first stabilizing circuit disposed between an output of a first transistor among the transistors and a first output matching circuit connected to the first transistor, the first stabilizing circuit comprising a first band-pass filter, a high-pass filter, and a first resistor that are connected in parallel, the first band-pass filter allowing a signal of a frequency f1 lower than a central frequency fc of an operation frequencies as an amplifier to pass through, the high-pass filter allowing a signal of a frequency equal to or higher than the central frequency fc to pass through; and a second stabilizing circuit disposed between an output of a second transistor being one of the transistors and different from the first transistor and a second output matching circuit connected to the second transistor, the second stabilizing circuit comprising a second band-pass filter, a low-pass filter, and a second resistor that are connected in parallel, the second band-pass filter allowing a signal of a frequency f2 higher than the central frequency fc to pass through, the low-pass filter allowing a signal of a frequency equal to or lower than the central frequency fc to pass through. Thus, a preferable noise figure can be obtained over a broad bandwidth, and the gain flatness can be enhanced within the operation frequencies.

Embodiment 3

Figure 6:
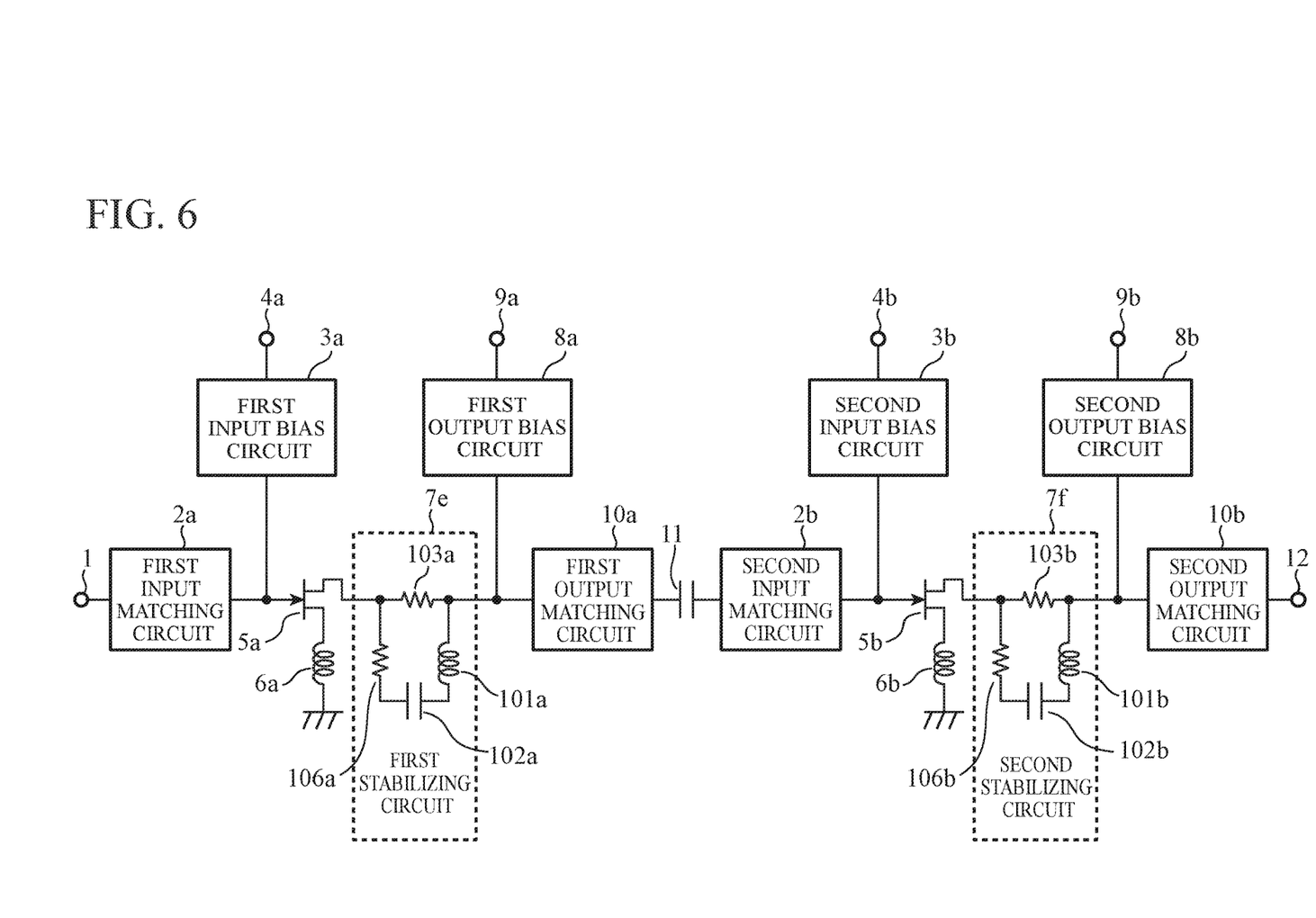
FIG. 6 is a configuration diagram illustrating a multi-stage high-frequency amplifier according to Embodiment 3 of the invention.

FIG. 6 is a configuration diagram illustrating a multi-stage high-frequency amplifier according to Embodiment 3. In Embodiment 3, the multi-stage high-frequency amplifier includes a first stabilizing circuit 7e and a second stabilizing circuit 7f which have different configurations from the first stabilizing circuit 7a and the second stabilizing circuit 7b in Embodiment 1, respectively. The configuration other than the first and second stabilizing circuits 7e and 7f in FIG. 6 is the same as that of Embodiment 1 in FIG. 1, so that the same components are denoted by the same reference numerals and the description thereof is omitted.

The first stabilizing circuit 7e includes a series circuit and a first resistor 103a connected in parallel. The series circuit includes a third resistor 106a and an LC series resonant circuit having a first inductor 101a and a first capacitor 102a and resonating at a frequency f1. The second stabilizing circuit 7f includes a series circuit and a second resistor 103b that are connected in parallel. The series circuit includes a fourth resistor 106b and an LC series resonant circuit having a second inductor 101b and a second capacitor 102b and resonating at a frequency f2. In this configuration, since resistors (the third and fourth resistors 106a and 106b) are inserted to be connected to the respective LC series resonant circuits in series, transmission loss occurs in the frequency bandwidth between the frequency f1 and the frequency f2. Thus, in addition to maintaining the gain flatness, by desirably setting the respective resistance values of the third and fourth resistors 106a and 106b, the stability within the operation bandwidth can be flexibly changed, and as a result, the flexibility in design is increased.

As described above, the multi-stage high-frequency amplifier according to Embodiment 3 includes: transistors arranged in different stages and connected in series, each transistor being provided with a source inductor, and an output matching circuit being disposed between adjacent two of the transistors; a first stabilizing circuit disposed between an output of a first transistor among the transistors and a first output matching circuit connected to the first transistor, the first stabilizing circuit comprising a first series circuit and a first resistor that are connected in parallel, the first series circuit including a first band-pass filter and a third resistor connected in series, the first band-pass filter allowing a signal of a frequency f1 lower than a central frequency fc of an operation frequencies as an amplifier to pass through; and a second stabilizing circuit disposed between an output of a second transistor being one of the transistors and different from the first transistor and a second output matching circuit connected to the second transistor, the second stabilizing circuit comprising a second series circuit and a second resistor that are connected in parallel, the second series circuit including a second band-pass filter and a fourth resistor connected in series, the second band-pass filter allowing a signal of a frequency f2 higher than the central frequency fc to pass through. Thus, a preferable noise figure can be obtained over a broad bandwidth, and the gain flatness can be enhanced within the operation frequencies.

Embodiment 4

Figure 7:
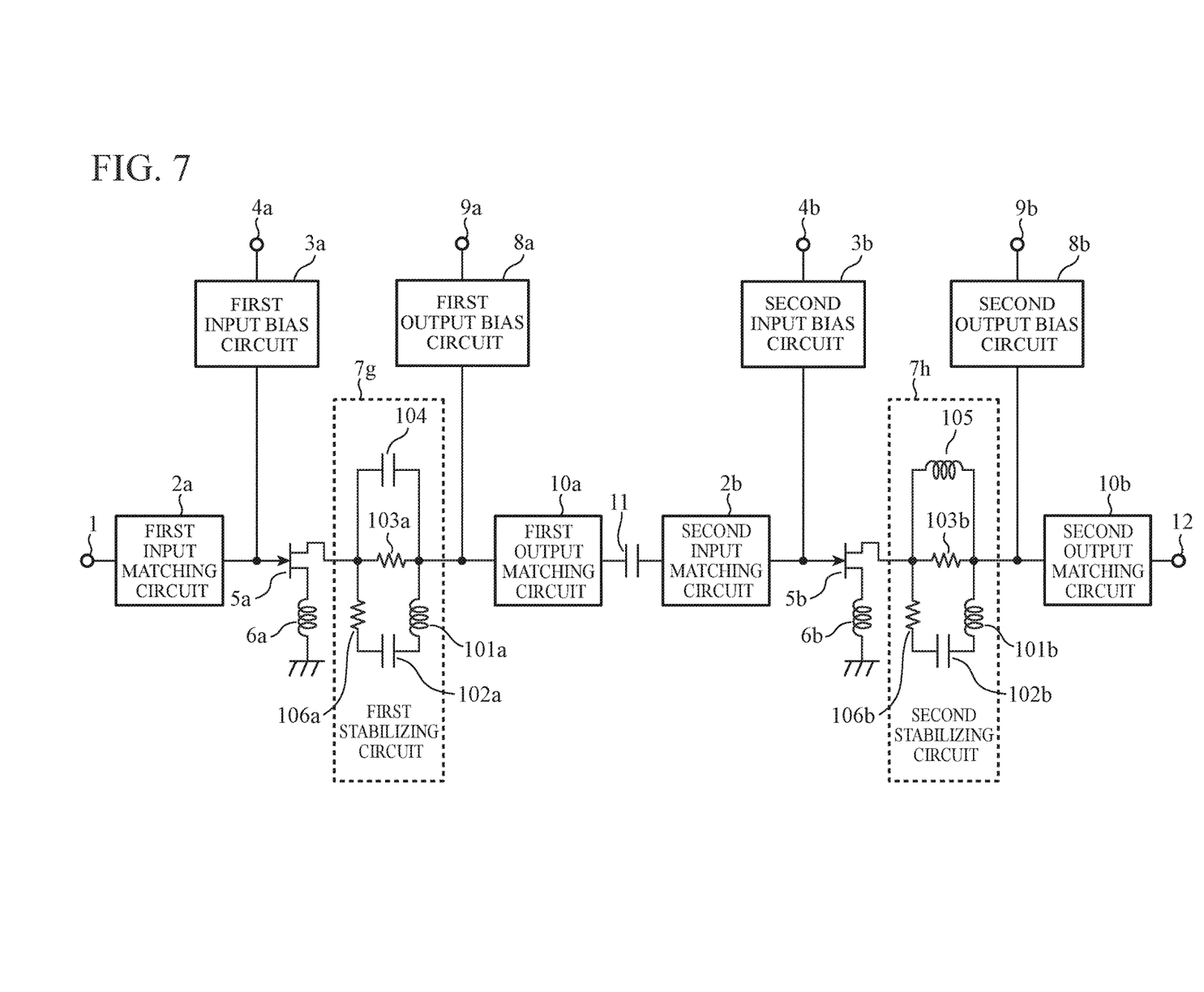
FIG. 7 is a configuration diagram illustrating a multi-stage high-frequency amplifier according to Embodiment 4 of the invention.

FIG. 7 is a configuration diagram illustrating a multi-stage high-frequency amplifier according to Embodiment 4. In Embodiment 4, the multi-stage high-frequency amplifier includes a first stabilizing circuit 7g and a second stabilizing circuit 7h which have different configurations from the first stabilizing circuit 7a and the second stabilizing circuit 7b in Embodiment 1, respectively. The configuration other than the first and second stabilizing circuits 7g and 7h in FIG. 7 is the same as that of Embodiment 1 in FIG. 1, so that the same components are denoted by the same reference numerals and the description thereof is omitted.

The first stabilizing circuit 7e includes a series circuit, a first resistor 103a, and a capacitor 104 that are connected in parallel. The series circuit includes a third resistor 106a and an LC series resonant circuit having a first inductor 101a and a first capacitor 102a and resonating at a frequency f1. The capacitor 104 functions as a high-pass filter allowing a signal equal to or higher than the frequency fc to pass through. The second stabilizing circuit 7f includes a series circuit, a second resistor 103b, and an inductor 105 that are connected in parallel. The series circuit includes a fourth resistor 106b and an LC series resonant circuit having a second inductor 101b and a second capacitor 102b and resonating at a frequency f2. The inductor 105 functions as a low-pass filter allowing a signal equal to or lower than a frequency fc to pass through. In this configuration, since resistors (the third and fourth resistors 106a and 106b) are inserted to be connected to the respective LC series resonant circuits in series, transmission loss occurs in the frequency bandwidth between the frequency f1 and the frequency f2, similar to Embodiment 3. Thus, in addition to maintaining the gain flatness, by desirably setting the respective resistance values of the third and fourth resistors 106a and 106b, the stability within the operation bandwidth can be flexibly changed, and as a result, the flexibility in design is increased.

As described above, the multi-stage high-frequency amplifier according to Embodiment 4 includes: transistors arranged in different stages and connected in series, each transistor being provided with a source inductor, and an output matching circuit being disposed between adjacent two of the transistors; a first stabilizing circuit disposed between an output of a first transistor among the transistors and a first output matching circuit connected to the first transistor, the first stabilizing circuit comprising a first series circuit, a high-pass filter, and a first resistor that are connected in parallel, the first series circuit including a first band-pass filter and a third resistor connected in series, the first band-pass filter allowing a signal of a frequency f1 lower than a central frequency fc of an operation frequencies as an amplifier to pass through, the high-pass filter allowing a signal of a frequency equal to or higher than the central frequency fc to pass through; and a stabilizing circuit disposed between an output of a second transistor being one of the transistors and different from the first transistor and a second output matching circuit connected to the second transistor, the stabilizing circuit comprising a second series circuit, a low-pass filter, and a second resistor that are connected in parallel, the second series circuit including a second band-pass filter and a fourth resistor connected in series, the second band-pass filter allowing a signal of a frequency f2 higher than the central frequency fc to pass through, the low-pass filter allowing a signal of a frequency equal to or lower than the central frequency fc to pass through. Thus, a preferable noise figure can be obtained over a broad bandwidth, and the gain flatness can be enhanced within the operation frequencies.

In the above Embodiments 1 to 4, an input bias circuit and an output bias circuit is provided in a single-stage amplifier. However, the bias power source means does not necessarily required to include two power sources. Alternatively, the amplifier may be configured by connecting two or more single-stage amplifiers, each of which is formed by a self-bias circuit, in series to form a multi-stage amplifier.

Further, in the above Embodiments 1 to 4, the first stabilizing circuit 7a is disposed between the first transistor 5a and the first output matching circuit 10a in the first stage viewed from the high-frequency input terminal 1, and the second stabilizing circuit 7b is disposed between the second transistor 5b and the second output matching circuit 10b in the second stage viewed from the high-frequency input terminal 1. However, the configuration is not limited to the above, and the first stabilizing circuit 7a or second stabilizing circuit 7b may be disposed in any stage. Moreover, each of the first and second stabilizing circuits 7a and 7b may be provided in amplifiers in two or more stages, respectively.

It should be noted that, the present invention can include any combination of embodiments, or modifications or omission of any component in the embodiments within the scope of the invention.

INDUSTRIAL APPLICABILITY

As described above, the multi-stage high-frequency amplifier according to the present invention relates to the configuration of amplifiers each includes a stabilizing circuit and are connected in series to form a multi-stage amplifier, and is suitable for use in high-frequency power amplifier for amplifying high-frequency signals of microwave, milliwave, or the like.

REFERENCE SIGNS LIST

1 high-frequency input terminal
2a first input matching circuit
2b second input matching circuit
3a first input bias circuit
3b second input bias circuit
4a first input bias power terminal
4b second input bias power terminal
5a first transistor
5b second transistor
6a first source inductor
6b second source inductor
7a first stabilizing circuit
7b second stabilizing circuit
8a first output bias circuit
8b second output bias circuit
9a first output bias power terminal
9b second output bias power terminal
10a first output matching circuit
10b second output matching circuit
11 capacitor
12 high-frequency output terminal
101a first inductor
101b second inductor
102a first capacitor
102b second capacitor
103a first resistor
103b second resistor
104 capacitor
105 inductor
106a third resistor
106b fourth resistor

The invention claimed is:

1. A multi-stage high-frequency amplifier comprising:
transistors arranged in different stages and connected in series, each transistor being provided with a source inductor, and an output matching circuit being disposed between adjacent two of the transistors;
a first stabilizing circuit disposed between an output of a first transistor among the transistors and a first output matching circuit connected to the first transistor, the first stabilizing circuit comprising a first band-pass filter, a high-pass filter, and a first resistor that are connected in parallel, the first band-pass filter allowing a signal of a frequency f1 lower than a central frequency fc of an operation frequency as an amplifier to pass through, the high-pass filter allowing a signal of a frequency equal to or higher than the central frequency fc to pass through; and
a second stabilizing circuit disposed between an output of a second transistor being one of the transistors and different from the first transistor and a second output matching circuit connected to the second transistor, the second stabilizing circuit comprising a second band-pass filter, a low-pass filter, and a second resistor that are connected in parallel, the second band-pass filter allowing a signal of a frequency f2 higher than the central frequency fc to pass through, the low-pass filter allowing a signal of a frequency equal to or lower than the central frequency fc to pass through.

2. A multi-stage high-frequency amplifier comprising:
transistors arranged in different stages and connected in series, each transistor being provided with a source inductor, and an output matching circuit being disposed between adjacent two of the transistors;
a first stabilizing circuit disposed between an output of a first transistor among the transistors and a first output matching circuit connected to the first transistor, the first stabilizing circuit comprising a first series circuit, a high-pass filter, and a first resistor that are connected in parallel, the first series circuit including a first band-pass filter and a third resistor connected in series, the first band-pass filter allowing a signal of a frequency f1 lower than a central frequency fc of an operation frequency as an amplifier to pass through, the high-pass filter allowing a signal of a frequency equal to or higher than the central frequency fc to pass through; and
a second stabilizing circuit disposed between an output of a second transistor being one of the transistors and different from the first transistor and a second output matching circuit connected to the second transistor, the second stabilizing circuit comprising a second series circuit, a low-pass filter, and a second resistor that are connected in parallel, the second series circuit including a second band-pass filter and a fourth resistor connected in series, the second band-pass filter allowing a signal of a frequency f2 higher than the central frequency fc to pass through, the low-pass filter allowing a signal of a frequency equal to or lower than the central frequency fc to pass through.

* * * * *